US011081665B2

(12) United States Patent
Nakagawa

(10) Patent No.: US 11,081,665 B2
(45) Date of Patent: Aug. 3, 2021

(54) DISPLAY DEVICE HAVING BUFFER LAYER

(71) Applicant: Japan Display Inc., Tokyo (JP)

(72) Inventor: Takuya Nakagawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 44 days.

(21) Appl. No.: 15/872,195

(22) Filed: Jan. 16, 2018

(65) Prior Publication Data

US 2018/0226608 A1    Aug. 9, 2018

(30) Foreign Application Priority Data

Feb. 3, 2017  (JP) .............................. JP2017-018758

(51) Int. Cl.
*H01L 51/52*    (2006.01)
*H01L 51/00*    (2006.01)
*H01L 27/32*    (2006.01)

(52) U.S. Cl.
CPC ...... *H01L 51/5246* (2013.01); *H01L 51/0097* (2013.01); *H01L 51/5253* (2013.01); *H01L 27/3244* (2013.01); *H01L 2251/5338* (2013.01); *H01L 2251/558* (2013.01)

(58) Field of Classification Search
CPC ............ H01L 51/5246; H01L 27/3258; H01L 27/3246
See application file for complete search history.

(56) References Cited

U.S. PATENT DOCUMENTS

2007/0114519 A1   5/2007  Hayashi
2010/0301742 A1  12/2010  Moriwaki
2012/0292105 A1  11/2012  Fujita
2014/0232962 A1   8/2014  Ishida et al.
2016/0013442 A1   1/2016  Akimoto et al.
2016/0190503 A1*  6/2016  Chang ................. H01L 51/5253
                                                              257/40
2018/0123082 A1*  5/2018  Sasaki ................ H01L 51/5237
2018/0269427 A1*  9/2018  Park .................... H01L 51/5256

FOREIGN PATENT DOCUMENTS

JP    2014-160603 A    9/2014
JP    2016-018758 A    2/2016

OTHER PUBLICATIONS

Japanese Office Action dated Sep. 29, 2020 for the corresponding Japanese Application No. 2017-018758, with English machine translation.

* cited by examiner

*Primary Examiner* — Suberr L Chi
(74) *Attorney, Agent, or Firm* — Michael Best & Friedrich LLP

(57) ABSTRACT

A display device including a first substrate including a display part arranged with a plurality of pixels and a terminal part arranged in an outside of the display part, the display part and the terminal part being on a first surface of the substrate, a second substrate facing the first surface, a first sealing layer arranged between the first substrate and the second substrate, and a buffer layer adjacent to the first sealing layer. A part of an end part of the first sealing layer is arranged between the display part and the terminal part, the part of the end part and an upper surface of the first sealing layer form a first step part, the buffer layer is located at the first step part and has a thickness which decreases as a distance from the first step increases.

11 Claims, 14 Drawing Sheets

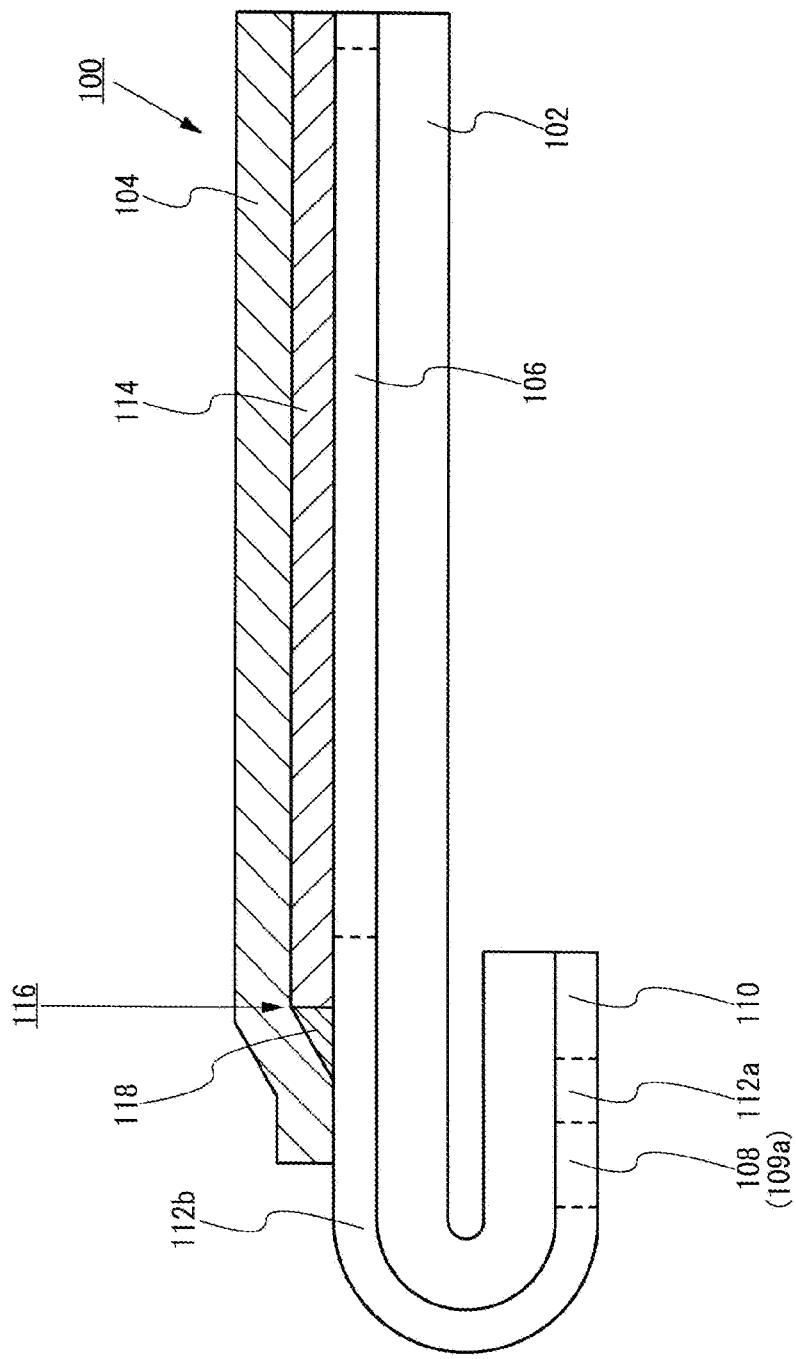

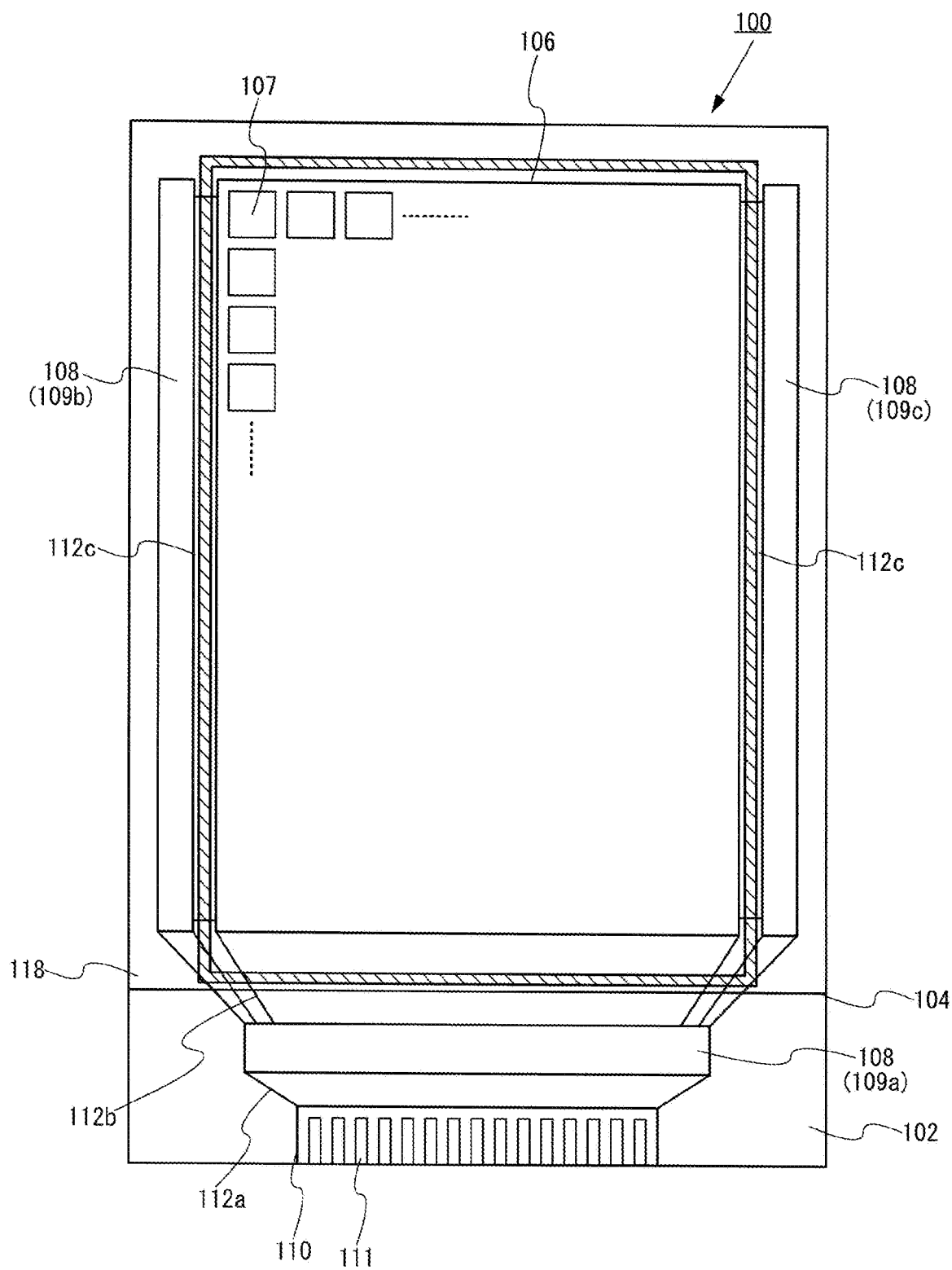

DISPLAY DEVICE HAVING BUFFER LAYER

CROSS REFERENCE TO RELATED APPLICATIONS

This application is based upon and claims the benefit of priority from the prior Japanese Patent Application No. 2017-018758, filed on Feb. 3, 2017, the entire contents of which are incorporated herein by reference.

FIELD

One embodiment of the present invention is related to a sealing structure of a display device.

BACKGROUND

A display device using a light emitting element called an organic light emitting diode is being developed. In this display device, since a light emitting element forming a pixel deteriorates due to moisture or the like, a sealing layer covering a pixel region is necessary. For example, as a sealing structure of a display device, a structure is disclosed in which a sealing film is arranged to cover a pixel region and a sealing substrate formed from an insulating material such as glass or plastic is further bonded thereto (see Japanese Laid Open Patent Publication No. 2016-018758). In addition, as another embodiment, a structure is disclosed in which a second resin substrate is bonded so as to face a first resin substrate, and organic light emitting diodes arranged in each pixel are sealed (see Japanese Laid Open Patent Publication No. 2014-160603).

SUMMARY

A display device according to one embodiment includes a first substrate including a display part arranged with a plurality of pixels and a terminal part arranged in an outside of the display part, the display part and the terminal part being on a first surface of the substrate, a second substrate facing the first surface, a first sealing layer arranged between the first substrate and the second substrate, and a buffer layer adjacent to the first sealing layer. A part of an end part of the first sealing layer is arranged between the display part and the terminal part, the part of the end part and an upper surface of the first sealing layer form a first step part, the buffer layer is located at the first step part and has a thickness which decreases as a distance from the first step increases, and the second substrate is arranged along the upper surface of the first sealing layer and an upper surface of the buffer layer.

A display device according to one embodiment includes a first substrate including a display part arranged with a plurality of pixels, a terminal part arranged in an outside of the display part, and a wiring part between the display part and the terminal part, the display part, the terminal part, and the wiring part being on a first surface of the substrate, a second substrate facing the first surface, a first sealing layer arranged between the first substrate and the second substrate, and an organic film covering a part of the wiring part. A part of an end part of the first sealing layer is arranged between the display part and the terminal part, the part of the end part and an upper surface of the first sealing layer form a first step part, the organic film stretches as far as the first step, and the second substrate is arranged along the upper surface of the first sealing layer and an upper surface of the organic film.

BRIEF DESCRIPTION OF DRAWINGS

FIG. 3 is a cross-sectional view diagram of a structure of a display device related to one embodiment of the present invention;

FIG. 4 is a planar view diagram of a structure of a display device related to one embodiment of the present invention;

DESCRIPTION OF EMBODIMENTS

The embodiments of the present invention are explained below while referring to the diagrams. However, it is possible to work the present invention using various different aspects, and the present invention should not be limited to the content described in the embodiments exemplified herein. Although the width, thickness and shape of each component are shown schematically compared to their actual aspect in order to better clarify explanation, the drawings are merely an example and should not limit an interpretation of the present invention. In addition, in the specification and each drawing, the same reference symbols (or reference symbols such as a and b attached after numbers) are attached to similar elements and elements that have been mentioned in previous drawings, and therefore a detailed explanation may be omitted where appropriate. Furthermore, characters denoted by "first" and "second" attached to each element are appropriate signs used in order to distinguish each element and unless otherwise stated do not have any further meaning.

In the present specification, in the case where certain parts or regions are given as "above (or below)" other parts or regions, as long as there is no particular limitation, these include parts which are not only directly above (or directly below) other parts or regions but also in an upper direction (or lower direction). That is, in the case where certain parts or regions are given as "above (or below)" other parts or regions, other structural elements may be included between other parts or regions in an upper direction (or lower direction). In the explanation herein, unless otherwise stated, a pixel region with respect to one main surface of a substrate, and a side arranged with a touch sensor in a cross-sectional view are explained as "upper".

First Embodiment

Figure 1:
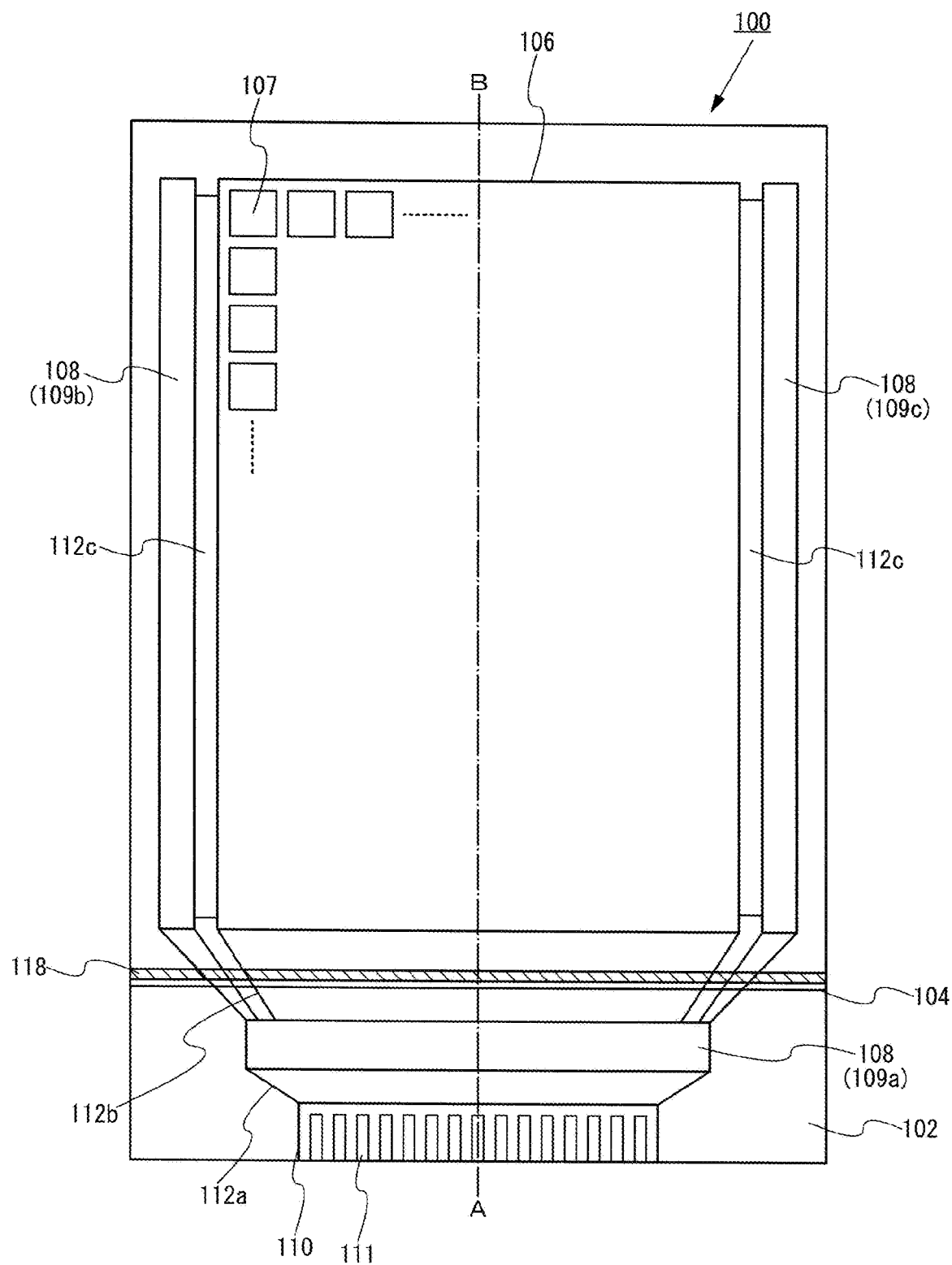
FIG. 1 is a planar view diagram of a structure of a display device related to one embodiment of the present invention.
Figure 2:
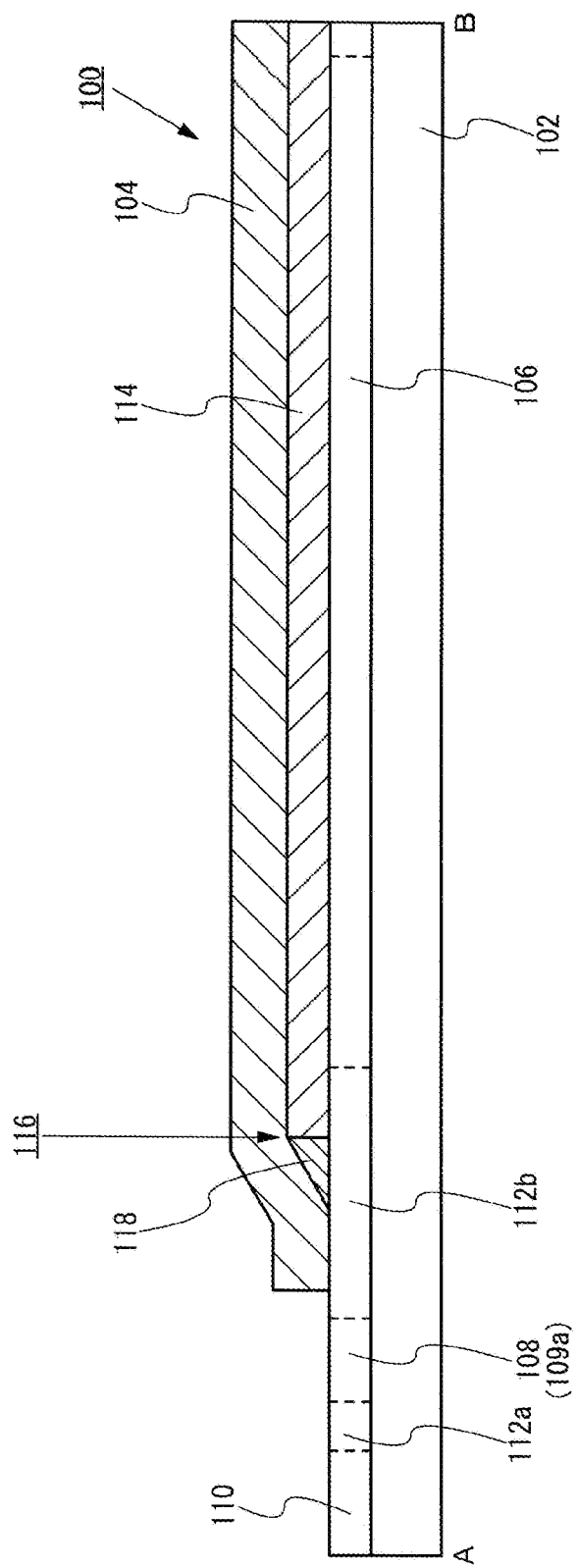
FIG. 2 is a cross-sectional view diagram of a structure of a display device related to one embodiment of the present invention.

The structure of the display device according to the present embodiment is explained while referring to FIG. 1 and FIG. 2. FIG. 1 shows the structure of a display device 100 in a planar view. FIG. 2 shows a cross-sectional structure along line A-B shown in FIG. 1. In the explanation below, a case of viewing a display part 106 of the display device 100 as if looking from the front as shown in FIG. 1 is referred to as a "planar view", and as is shown in FIG. 2, a case of viewing a certain cross-sectional surface of the display device 100 from the vertical direction is called a "cross-sectional view".

As is shown in FIG. 1, in the display device 100 in a planar view, the display part 106 is arranged on a first surface of a first substrate 102. A plurality of pixels 107 is arranged on the display part 106. The plurality of pixels 107 is arranged, for example, to form a matrix in a row direction and a column direction. An outer end of the display part 106 is arranged in an inner side region not reaching the end part of the first substrate 102. A second substrate 104 is arranged to cover the display part 106. The second substrate 104 is arranged facing the first substrate 102. An outer end part of the second substrate 104 is arranged on the outer side of the display part 106. The display part 106 is arranged on the inner side of the first substrate 102 and the second substrate 104, and is arranged to be sandwiched therebetween.

In addition, although not explicitly shown in FIG. 1, a sealing layer is arranged between the display part 106 and the second substrate 104. At least one end of the sealing layer is arranged on the inner side the outer end of the second substrate 104. FIG. 1 shows an aspect in which one side of the sealing layer is arranged further to the inner side than a region where a terminal part 110 and a first drive circuit 109a are arranged.

As is shown in FIG. 1, a drive circuit part 108 is arranged in a region on the outer side of the display part 106. The drive circuit part 108 includes a circuit which outputs a signal for driving a pixel 107. FIG. 1 shows an embodiment in which a first drive circuit 109a, a second drive circuit 109b, and a third drive circuit 109c are arranged as the drive circuit part 108. The first drive circuit 109a is a circuit which outputs an image signal to the pixels 107 of the display part 106 and the second drive circuit 109b and the third drive circuit 109c are circuits which output scanning signals to the pixels 107 of the display part 106.

A terminal part 110 is arranged on the first substrate 102. The terminal part 110 includes a plurality of terminal electrodes 111. The plurality of terminal electrodes 111 is arranged at an end part of the first substrate 102. A signal for driving the display device 100 is applied to the terminal part 110. The terminal part 110 is arranged on the outer side of the second substrate 104 in order to connect with a wiring substrate (not shown in the diagram). In other words, one side of the second substrate 104 is arranged further to the inside than one side where the terminal part of the first substrate 102 is arranged. FIG. 1 shows an embodiment in which the first drive circuit part 108a and the terminal part 110 are arranged exposed from the second substrate 104.

A first wiring part 112a is arranged between the terminal part 110 and the drive circuit part 108, and the drive circuit part 108 and the display part 106 are connected by a second wiring part 112b and a third wiring part 112c. Although omitted in FIG. 1, the wiring part 112 includes a plurality of wirings. The plurality of wirings may be multi-layered interposed by an interlayer insulating film therebetween.

As is shown in FIG. 2, in a cross-sectional view, the display device 100 is arranged with a sealing layer 114 on an upper surface (surface on the side opposite to the first substrate 102) of the display part 106. The outer end of the sealing layer 114 is arranged further to the outer side than the outer end of the display part 106. The sealing layer 114 has a layer structure in which one film or a plurality of films are stacked. For example, the sealing layer 114 is formed from an inorganic insulating film. In addition, the sealing layer 114 has a structure in which an inorganic insulating film and an organic insulating film (or an organic resin film) are stacked. As an example, the sealing layer 114 has a stacked structure in which an inorganic insulating film is arranged on the lower layer side and the upper layer side of the organic insulating film. The sealing layer 114 has a certain thickness.

Since the sealing layer 114 is formed from an insulating film, one side of the sealing layer 114 on the side of the terminal part 110 is arranged in an inner side region which does not reach the end part of the first substrate 102. Therefore, the sealing layer 114 forms at least one step part 116 on a first surface side of the first substrate 102. The height of the step part 116 formed by the sealing layer 114 is substantially the thickness of the sealing layer 114 and has a height of 5 μm or more and preferably 10 μm or more. As described above, since the outer end of the sealing layer 114 is arranged on the outer side of the display part 106, the step part 116 is formed in a region between the display part 106 and the terminal part 110, or between the display part 106 and the drive circuit part 108 (the first drive circuit 109a).

The second substrate 104 is arranged on the first surface side of the first substrate 102. The second substrate 104 is arranged to cover the display part 106 and the sealing layer 114. As is shown in FIG. 2, the second substrate 104 buries the step part 116 and extends to a region on the outer side of one end of the sealing layer 114.

In the present embodiment, a film shaped substrate formed from a resin material is used for the first substrate 102 and the second substrate 104. For example, a polyimide film with a thickness of about 10 μm to 200 μm is applied as the first substrate 102, and a film formed of polyethylene terephthalate and polyethylene naphthalate having the same thickness is applied as the second substrate 104. The first substrate 102 and the second substrate 104 have flexibility by being formed of a resin film having a thickness of 10 μm to 200 μm.

As is shown in FIG. 2, the second substrate 104 is bonded to the first substrate 102 including the step part 116 which is formed by the sealing layer 114. The second substrate 104 has flexibility since it is formed from a resin film. An adhesive layer or a bonding layer is attached to the surface of the resin film to be bonded to the first substrate 102 and thereby the resin film is bonded to the base surface. However, since the step part 116 is present on the underlying surface of the second substrate 104, the step can not be successfully covered and there is a problem that gaps are formed in this part.

In the display device 100 according to the present embodiment, a buffer layer 118 is arranged in contact with a side wall surface of the sealing layer 114 in the step part 116. The buffer layer 118 is formed in contact with a step surface of the step part 116 which is formed by the sealing layer 114. As is shown in FIG. 2, in a cross-sectional view, the buffer layer 118 has a shape whereby its thickness gradually decreases from the step surface side of the step part 116 towards the direction in which the terminal part 110 is arranged. In other words, the buffer layer 118 has approximately the same height as the step part 116 at the surface in contact with the sealing layer 114, and has a form in which the thickness decreases with distance from the step part 116. It may also be said that the buffer layer 118 has a taper surface or an inclined surface formed on an upper surface thereof.

FIG. 3 shows a state in which the first substrate 102 which has flexibility is bent. By bending the first substrate 102, the region where the drive circuit part 108 (first drive circuit 109a) and the terminal part 110 are arranged is arranged on a second surface side opposite to the first surface of the first substrate 102. A wiring part 112 is included in the region where the first substrate 102 is bent. By arranging a region where the drive circuit part 108 (first drive circuit 109a) and the terminal part 110 are arranged on the back side of the display part 106, It is possible to apparently narrow the region of the display device 100 other than the display portion 106 in a planar view. In other words, it is possible to achieve narrowing of the frame of the display device 100. The second substrate 104 is arranged in close contact with the first substrate 102 by arranging the buffer layer 118. Therefore, even when the first substrate 102 is bent, it is possible to prevent the end part of the second substrate 104 from being peeling off. In addition, since the second substrate 104 is closely adhered to the first substrate 102, the bent part of the first substrate 102 can be arranged further to the inner side. In other words, it is possible to arrange the bent part of the first substrate 102 closer to the end part of the second substrate 104. In this way, it is possible to further narrow the frame of the display device 100.

Furthermore, the buffer layer 118 may be arranged to surround the outline part of the display part 106 as is shown in FIG. 4. The buffer layer 118 is arranged in a region between the display part 106 and the drive circuit part 108 (first drive circuit 109a, second drive circuit 109b and third drive circuit 109c). In this way, by arranging the buffer layer 118 not only on one side of the side of the first substrate 102 on which the terminal part 110 is arranged, but also along another side, it is possible to form the second substrate 104 on the upper surface of the sealing layer 114 in addition to the side surface. In this way, it is possible to increase sealing performance.

Figure 5A:
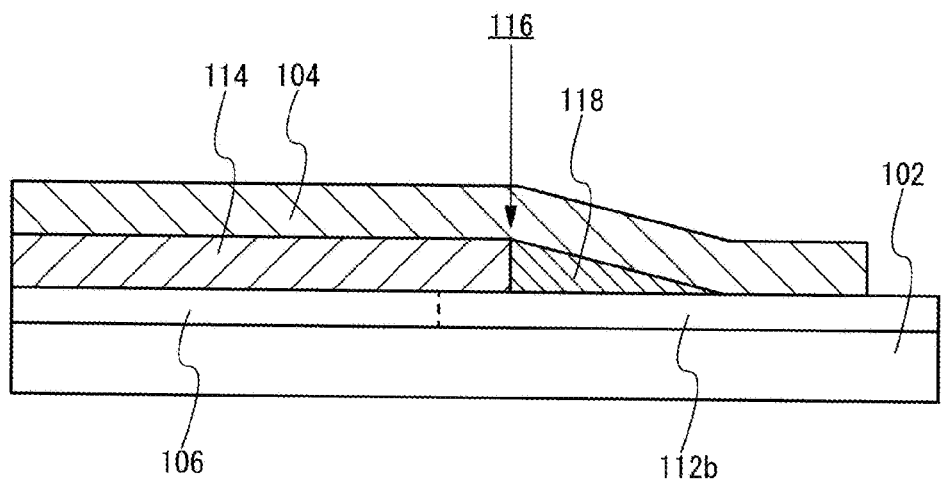
FIG. 5A and FIG. 5B are cross-sectional diagrams exemplifying a form of a buffer layer in a display device related to one embodiment of the present invention.

FIG. 5A and FIG. 5B, and FIG. 6A and FIG. 6B show a number of aspects the of buffer layer 118 in a cross-sectional view. FIG. 5A shows an aspect in which the thickness decreases linearly as the buffer layer 118 contacts with the side surface of the sealing layer 114 and separates from the step part 116. The buffer layer 118 has a taper shape in a cross-sectional view. According to the buffer layer 118 shown in FIG. 5A, since the thickness gradually decreases from the step part 116, it is possible to relieve a sudden variation in height at the step part 116.

Figure 5B:
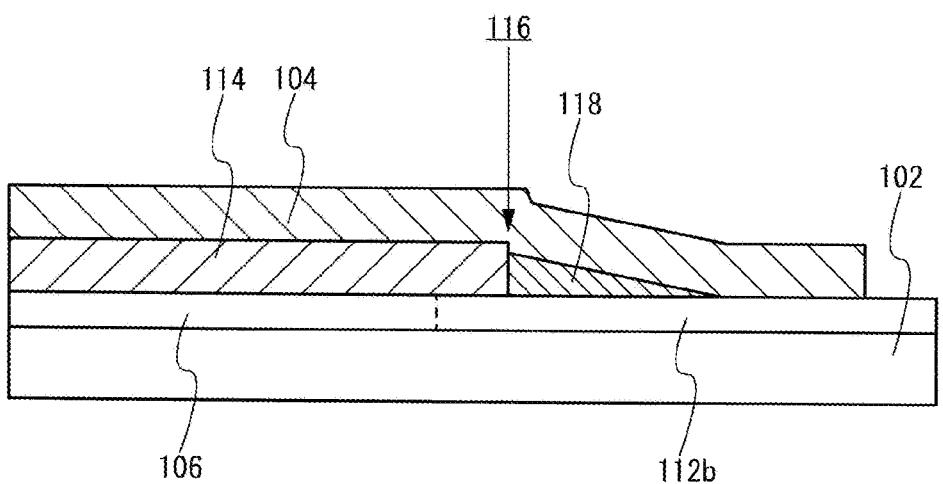

Furthermore, in FIG. 5A, the height of the side of the buffer layer 118 in contact with the sealing layer 114 approximate matches the height of the sealing layer 114. However, the buffer layer 118 is not limited to such a form and the thickness of the part in contact with the buffer layer 118 may be smaller than the thickness of the sealing layer 114. As shown in FIG. 5B, the height of the buffer layer 118 in contact with the step part 116 may be lower than the height of the step part 116 (in other words, the height of the sealing layer 114). That is, the maximum height (thickness) of the buffer layer 118 may be smaller than the step part 116 as long as the second substrate 104 is tightly contacted and it is of a height that can be covered. For example, the height (thickness) of the part of the buffer layer 118 in contact with the step surface may be 80% to 100% of the height of the step part 116.

On the other hand, in the case when the height (thickness) of the buffer layer 118 is higher than the height of the step part 116, the buffer layer 118 protrudes from the sealing layer 114. In this case, a part where the second substrate 104 can not come into close contact with the upper surface of the sealing layer 114 is formed when the buffer layer 118 protrudes, and an undesirable gap is formed in that part. Therefore, even if the buffer layer 118 protrudes from the sealing layer 114, it is preferred that the projecting height is within 10% of the height (thickness) of the buffer layer. From such a viewpoint, the height of the buffer layer 118 is preferred to be within a range of 80% to 110% of the height of the step part 116.

Figure 6A:
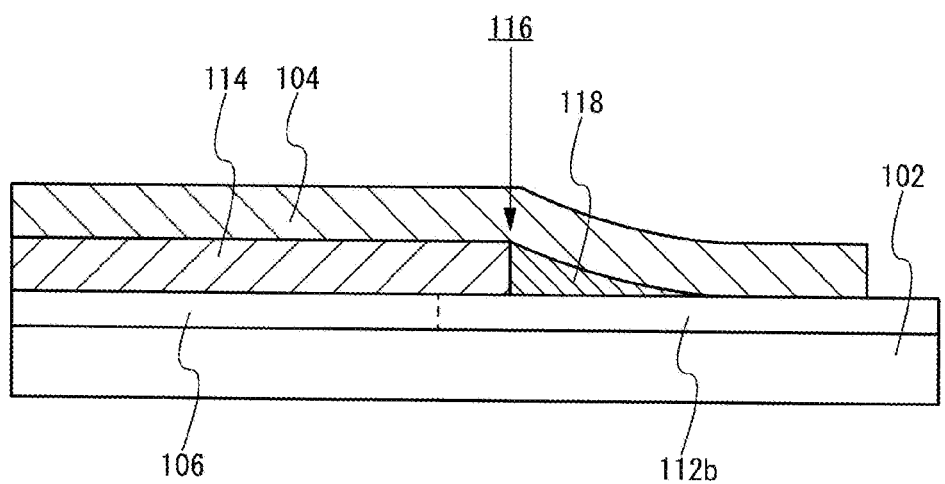
FIG. 6A and FIG. 6B are cross-sectional diagrams exemplifying a form of a buffer layer in a display device related to one embodiment of the present invention.
Figure 6B:
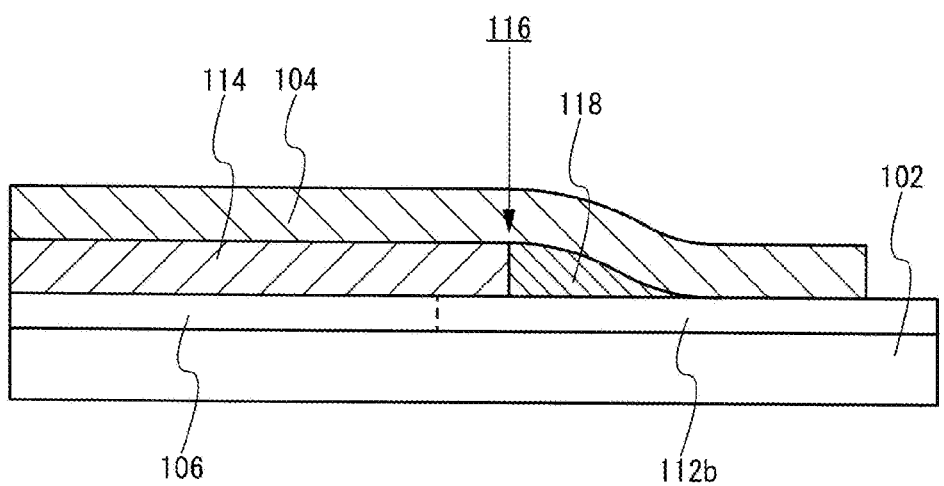

FIG. 6A shows a case where an inclined surface of the buffer layer 118 is a quadratic curve in a cross-sectional view. In addition, FIG. 6B shows a case where the inclined surface of a buffer layer 118 has a curved surface shape including an inflection point at the middle of the inclined surface in a cross-sectional view. In both the case of FIG. 6A and FIG. 6B, the inclined surface of the buffer layer 118 has a gently sloping curved surface, thereby it is possible to arrange the second substrate 104 in close contact. In other words, it is possible to arrange the second substrate 104 in close contact with a step part formed by arranging the sealing layer 114 so that a gap is not formed.

The buffer layer 118 is preferred to be formed from a resin material in order to form a gently sloping surface having a taper shape or a curved surface with a linear cross-section. An epoxy resin, an acrylic resin, a polyimide resin, or the like can be used as the resin material. The buffer layer 118 is sometimes also called a resin layer or a resin film. Since the buffer layer 118 has insulating properties, it is possible to prevent the generation of a parasitic capacitance between the display part 106, the wiring part 112, and the drive circuit part 108 arranged on a lower layer side (first substrate side). This structure of the buffer layer 118 can also be applied to a display device according to the second embodiment and the third embodiment described herein.

Figure 7A:
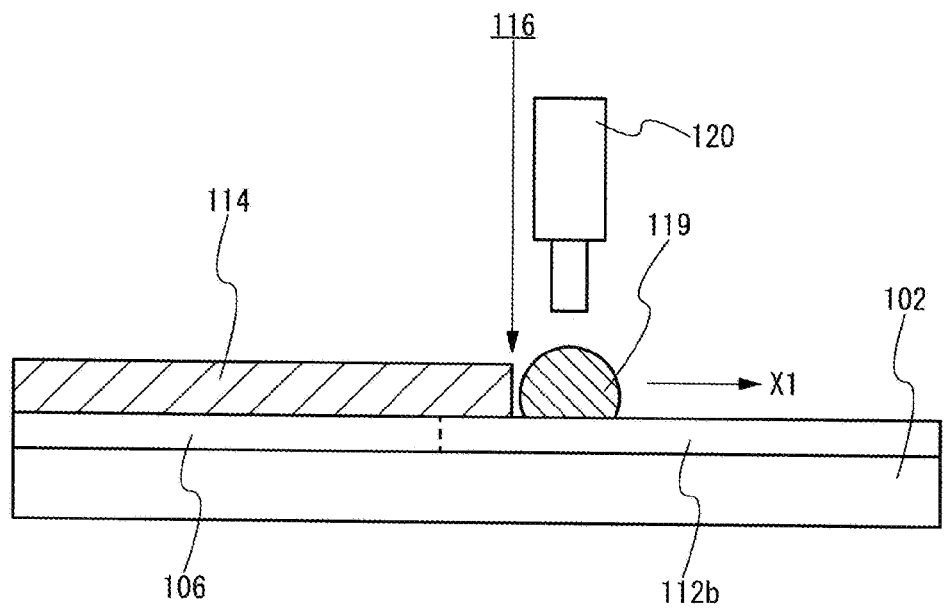
FIG. 7A and FIG. 7B are cross-sectional diagrams for explaining a manufacturing process of a display device related to one embodiment of the present invention.
Figure 7B:
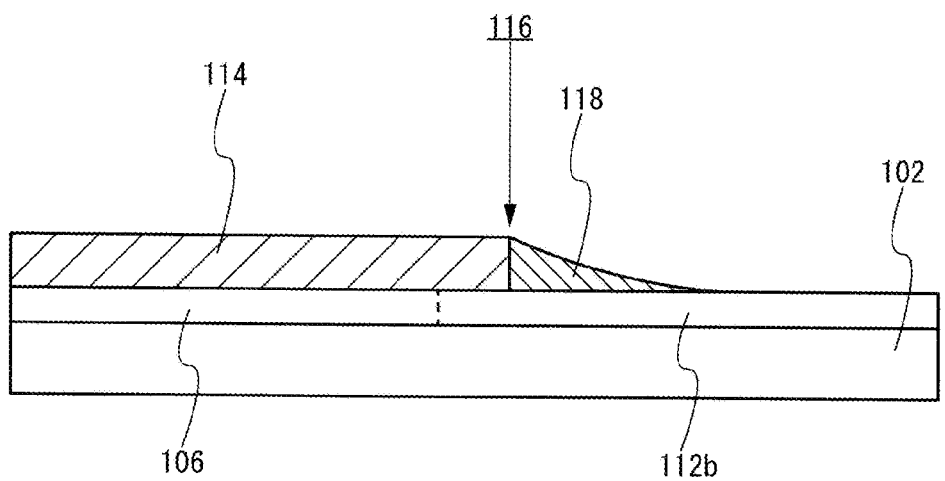

FIG. 7A and FIG. 7B show a manufacturing process of the buffer layer 118. FIG. 7A shows a step of arranging a resin material 119 in the vicinity of the step part 116 (in other words, adjacent to the end part of the sealing layer 114). The resin material 119 is applied using a coating device 120 such as a dispenser or an inkjet printing machine and the like. By controlling the droplet viscosity, wettability with the base surface and the leaving time of the resin material 119, the dropped resin material expands in a horizontal direction (direction X1 shown in FIG. 7A) and the film thickness gradually decreases so that a taper shape or an inclined surface shape is formed. In this case, since the side wall surface of the sealing layer 114 exists in a direction opposite to the direction X1, spreading of the dropped resin material 119 is controlled in the direction X1 and the horizontal direction along the step part 116 (perpendicular direction to the sheet surface of FIG. 7A). In addition, by controlling the amount of the resin material 119 which is dropped, it is possible to control the spreading width of the taper shape or the inclined surface and to prevent the resin material 119 from spreading on an upper surface of the sealing layer 114. Following this, since a heat treatment is performed in order to harden the resin material 119, the buffer layer 118 can be formed as is shown in FIG. 7B.

As is shown in FIG. 7B, after the buffer layer 118 is formed, the second substrate 104 is bonded. Since the buffer layer 118 can relieve a sharp step caused by the sealing layer 114, it is possible to provide the second substrate 104 in close contact with an underlying surface. That is, it is possible to prevent bubbles from embracing when bonding the second substrate 104.

Furthermore, the second substrate 104 may be a protective film which covers the display part 106. That is, the second substrate 104 may be a transparent resin film such as polyethylene terephthalate, polyethylene and naphthalate or the like. In addition, the second substrate 104 may be a polarization film (polarization plate) arranged with a polarizer. More specifically, the second substrate 104 may be a circularly polarization film (circularly polarization plate). The second substrate 104 is used as an optical film arranged on the viewer side of the display part 106. As another aspect, the second substrate 104 may also be a film substrate arranged with a touch sensor. In either case, even when the second substrate 104 is bonded, a gap is formed in the step part 116 and air bubbles can be prevented from entering, thereby it is possible to prevent defects in appearance.

As another aspect, the second substrate 104 may be a protective film used during the manufacturing process of a display panel. For example, the second substrate 104 may be a protective film for preventing the display part 106 from being scratched when handling the display panel. In this case, when bonding the second substrate 104, it is possible to prevent bubbles from being included in the step part 116, thereby it is possible to prevent the occurrence of defects during the manufacturing process.

As described above, according to the present embodiment, in the case when the sealing layer 114 for protecting the display part 106 is arranged, by providing the buffer layer 118 adjacent to the step part 116, it is possible to prevent the formation of gaps between the first substrate 102 and the second substrate 102 and/or prevent embracing air bubbles. In this way, it is possible to increase the adhesion of the second substrate 104 to an underlying surface. In addition, it is possible to prevent defects in appearance.

Second Embodiment

Figure 8:
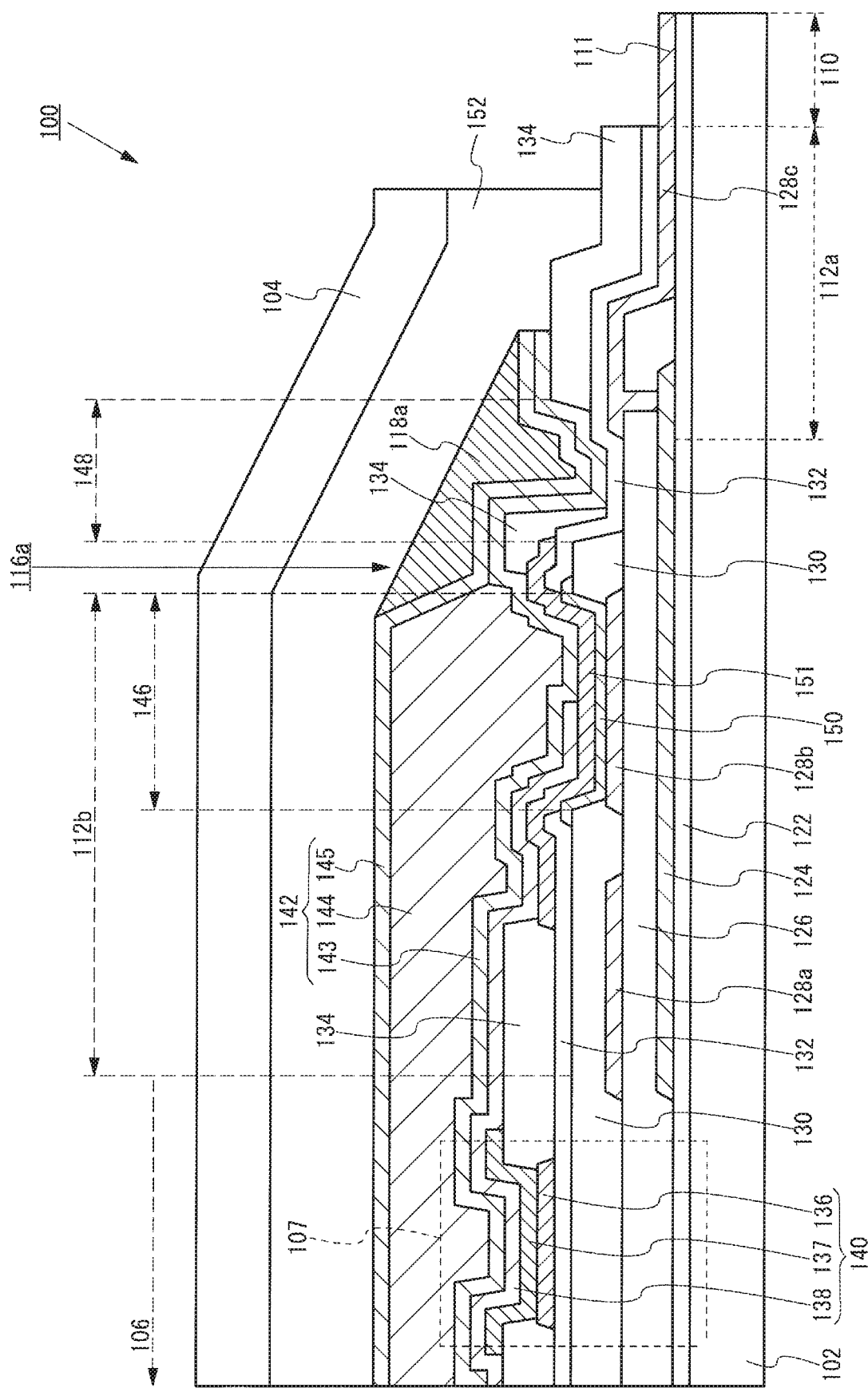
FIG. 8 is a cross-sectional view diagram of a structure of a display device related to one embodiment of the present invention.

The structure of the display device according to the present embodiment is shown in FIG. 8. FIG. 8 is a cross-sectional view showing details of the first substrate 102, the display part 106, the first sealing layer 142, the first step part 116a, the buffer layer 118 and the second substrate 104.

A first insulating layer 122, second insulating layer 126 and a third insulating layer 130 are stacked on a first surface of the first substrate 102. The first insulating layer 122 is formed from, for example, one or both of a silicon oxide film and a silicon nitride film. The first insulating layer 122 is also called an underlying insulating layer or a base coat layer. The second insulating layer 126 and the third insulating layer 130 are arranged as an interlayer insulating film. The second insulating layer 126 is formed from an inorganic insulating film such as a silicon oxide film and a silicon nitride film, and the third insulating layer 130 is formed using an organic insulating material such as an acrylic resin, an epoxy resin or a polyimide resin and the like. The third insulating layer 130 is also called a planarization film since the unevenness of the underlying surface is buried and the surface thereof is planarized. A fourth insulating layer 132 is arranged on the upper layer side of the third insulating layer 130. The fourth insulating layer 132 is a passivation film and is formed from an inorganic insulating film such as a silicon nitride film.

A first wiring layer 124 is arranged between the first insulating layer 122 and the second insulating layer 126. A second wiring layer 128 second wiring layer 128a, second wiring layer 128b and second wiring layer 128c) is arranged above the second insulating layer 126. An aspect in which the second wiring layer 128c arranged in the first wiring part 112a is used as wiring for electrically connecting the first wiring layer 124 arranged in the second wiring part 112b and the terminal electrode 111 of the terminal part 110 is shown. The first wiring layer 124 and the second wiring layer 128 are formed using a metal material such as aluminum, molybdenum, tungsten or titanium and the like. For example, the first wiring layer 124 is formed from a molybdenum-tungsten alloy and the second wiring layer 128 is formed by a stacked structure in which a titanium film is arranged on the upper layer side and the lower layer side of an aluminum film.

FIG. 8 shows a pixel 107 arranged in the display part 106. A light emitting element 140 is arranged in the pixel 107. The light emitting element 140 has a structure in which a pixel electrode 136, an organic electroluminescent layer including a light emitting material (also called an "organic EL layer 137" herein), and a common electrode 138 are stacked. A fifth insulating layer 134 is arranged on the upper layer side of the pixel electrode 136 and has an opening part exposing the upper surface of the pixel electrode 136. In the pixel 107, a region where the pixel electrode 136, the organic EL layer 137 and the common electrode 138 overlap is a light emitting region. That is, the opening part of the fifth insulating layer 134 defines a light emitting region. In addition, the fifth insulating layer 134 partitions the pixel 107 and an adjacent pixel. The fifth insulating layer 134 is also called a bank or a rib. The fifth insulating layer 134 is formed from an organic insulating material such as a polyimide resin, an acrylic resin or an epoxy resin.

Although not shown in FIG. 8, the organic EL layer 137 is formed from a plurality of layers including a light emitting material. For example, in addition to the light emitting layer including a light emitting material, the organic EL layer 137 may include a structure in which a hole injection layer, a hole transport layer, an electron block layer, a hole block layer, an electron transport layer and an electron injection layer are appropriately stacked. In the case where the light emitting element 140 emits light from the side of the common electrode 138, that is, a so-called top emission type structure, the pixel electrode 136 has a structure in which a metal film having light reflective properties such as aluminum (Al) or silver (Ag) and a transparent conductive film such as indium tin oxide (ITO) and indium zinc oxide (IZO) which have excellent hole injection properties are stacked. A transparent conductive film such as indium tin oxide or indium zinc oxide is used for the common electrode 138 in order to transmit light emitted from the organic EL layer 137. In addition, the common electrode 138 is formed from an aluminum-lithium film or a silver-magnesium film having light transmitting properties.

Furthermore, although not shown in FIG. 8, the pixel 107 includes at least one transistor in addition to the light emitting element 140. The transistor is formed below the pixel electrode 136. The pixel electrode 136 is electrically connected to a transistor formed below the third insulating layer 130. The light emitting element 140 emits light when the potential difference between the pixel electrode 136 and the common electrode 138 becomes equal to or higher than a light emission threshold voltage. In the light emitting element 140, the common electrode 138 is held at a constant potential and the potential of the pixel electrode 136 is controlled by the transistor. The state of light emission and non-light emission of the light emitting element 140 is controlled by a transistor.

The common electrode 138 is arranged over roughly the entire surface of the display part 106. The common electrode 138 is arranged spread across the upper surface of the fifth insulating layer 134, and a part thereof extends to the second wiring part 112b and is electrically connected to the second wiring layer 128b. An electrical connection part between the common electrode 138 and the second wiring layer 128b is also called a common contact. The third wiring layer 151 formed from the same layer as the pixel electrode 136, and an oxide conductive layer 150 may be interposed between the common electrode 138 and the second wiring layer 128b. The oxide conductive layer 150 is formed from a conductive material such as indium tin oxide or indium zinc oxide.

A region where the second wiring layer 128b is electrically connected to the common electrode 138 is a region where the third insulating layer 130 and the fifth insulating layer 134 are removed and an opening part is arranged. In the present embodiment, for convenience, this region is called a first opening part 146. The first opening part 146 is a region from which the third insulating layer 130 and the fifth insulating layer 134 which are formed from an organic resin material are removed. As a result of removal of the third insulating layer 130 and the fifth insulating layer 134, a structure is obtained in which the first opening part 146 is formed so that the first insulating layer 122 and the second insulating layer 126 which are formed from an inorganic insulating film are stacked on the surface of the substrate. In addition, the first wiring layer 124 is arranged between the first insulating layer 122 and the second insulating layer 126, and a structure is obtained in which the third wiring layer 151 which is formed from the same layer as the second wiring layer 128b, the oxide conductive layer 150 and the pixel electrode 136, and a common electrode 138 are stacked above the second insulating layer 126.

The first opening part 146 is arranged on the outer side of the display part 106 and is arranged to surround the display part 106 as is shown in FIG. 8. In the first opening part 146, an open-end part (side wall part of the opening part) of the third insulating layer is covered by the oxide conductive layer 150, and an open-end part (side wall part of the opening part) of the fifth insulating layer 134 is covered by the common electrode 138. In addition, although not shown in FIG. 8, a region where the oxide conductive layer 150 is not arranged is covered by the fourth insulating layer 132 at the open-end part of the third insulating layer 130. A region not covered by the common electrode 138 is covered by the first sealing layer 142 at the open-end part of the fifth insulating layer 134. The first sealing layer 142 has a structure in which a first inorganic insulating layer 143, an organic insulating layer 144 and a second inorganic insulating layer 145 are stacked.

An insulating layer formed from an organic resin material usually has a low dielectric constant, its thickness easily increases, and it has the advantage of being usable as a planarization film. On the other hand, an insulating layer formed from an organic resin material has a characteristic that its water vapor permeability is high compared to that of an inorganic insulating film. As a result, when the side end surfaces of the third insulating layer 130 and the fifth insulating layer 134 formed from an organic resin material are exposed to the atmosphere, water vapor enters from the side end surface which may deteriorate the light emitting element 140. However, as is shown in FIG. 8, the display device 100 has a first opening part 146 surrounding the outside of the display part 106 and a structure in which an inorganic insulating layer and a conductive layer formed of an inorganic conductive material are stacked in a first opening part 146. It is possible to prevent water vapor entering from the side end surface of the third insulating layer 130 and the fifth insulating layer 134 from entering the display part 106. Since the first opening part 146 has a function for preventing water vapor (moisture) from entering the display part 106, it can also be called a moisture blocking region.

A second opening part 148 from which the third insulating layer 130 and the fifth insulating layer 134 are removed may be further arranged in a region on the outer side of the first opening part 146. The second opening part 148 is arranged adjacent to the first opening part 146. Similar to the first opening part 146, the first insulating layer 122, the second insulating layer 126 and the fourth insulating layer 132 are stacked in an open region of the second opening part 148. The open-end part (side wall part of the opening part) of the third insulating layer 130 is covered by the fifth insulating layer 134, and the open-end part (side wall part of the opening part) of the fifth insulating layer 134 is covered by the first sealing layer 142. In this way, by arranging double opening parts, it is possible to prevent water vapor (moisture) from entering into the display part 106.

A first sealing layer 142 is arranged on the upper layer side of the common electrode 138. The first sealing layer 142 has a structure in which a plurality of insulating layers is stacked. FIG. 8 shows a structure in which a first inorganic insulating layer 143, an organic insulating layer 144 and a second inorganic insulating layer 145 are stacked as the first sealing layer 142. By having such a structure, for example, even if the first inorganic insulating layer 143 has defect, the organic insulating layer 144 fills the defective part and by providing the second inorganic insulating layer 145, it is possible to cover the defective part. It is possible to increase the sealing film function described above by providing an organic insulating film between inorganic insulating films having barrier properties against water vapor (moisture) as described above.

An end part of the organic insulating layer 144 is arranged on the inner side of the first opening part 146 in the first sealing layer 142. In other words, the end part of the organic insulating layer 144 is arranged at a position which does not exceed the first opening part 146. From the viewpoint of the manufacturing process, since there are recessed grooves caused by the first opening part 146, even if the organic insulating layer 144 is applied by a printing method, the coated organic insulating layer is prevented from flowing further to the outside than the first opening part by the recessed groove.

The end part of the organic insulating layer 144 of the first sealing layer 142 is arranged in the first opening part 146 and the end parts of the first inorganic insulating layer 143 and the second inorganic insulating layer 145 are arranged further to the outer side than the first opening part 146. The lower layer side of the organic insulating layer 144 contacts with the first inorganic insulating layer 143, and the upper layer side and side end parts are covered by the second inorganic insulating layer 145. By having such a stacked structure, the first sealing layer 142 has a structure in which the organic insulating layer 144 is covered by the first inorganic insulating layer 143 and the second inorganic insulating layer 145 and is not exposed to the exterior. Since the first sealing layer 142 has a structure in which the organic insulating layer 144 is not exposed, it is possible to increase the barrier properties against water vapor (moisture).

While in the first sealing layer 142, the thickness of the first inorganic insulating layer 143 and the second inorganic insulating layer 145 is 1 μm to 5 μm, the thickness of the organic insulating layer 144 is 10 μm to 20 μm. In this case, in the first sealing layer 142, the first step part 116a is formed at a height of at least 10 μm at the end part of the organic insulating layer 144.

The second substrate 104 is arranged on the upper layer of the first sealing layer 142. An adhesive layer 152 is arranged on the second substrate 104. A surface of the second substrate 104 on which the adhesive layer 152 is arranged faces the first substrate 102 and is bonded. The adhesive layer 152 has a thickness of 10 μm to 30 μm. Since the height of the first step 116a is 10 μm to 20 μm, even if the adhesive layer 152 has the thickness described above, it is not possible to sufficiently cover the first step 116a, and there is possibility that bubbles become mixed and voids are formed. However, in the present embodiment, by arranging the buffer layer 118a in contact with the first step part 116a, the steep step of the first step part 116a formed by the first sealing layer 142 is relieved.

The buffer layer 118a is arranged along the first step part 116a (or the step surface) formed by the first sealing layer 142. Since the buffer layer 118a is formed from a resin material, it buries the first step part 116a (or the step surface) of the first sealing layer 142 forming a gentle surface. As exemplified in the first embodiment, the shape of the buffer layer 118a is a shape in which the outer side surface which is not in contact with the first sealing layer 142 has a tapered shape and in which the thickness of the inclined surface is reduced similar to a quadratic curve, or a shape including an inflection point at the middle of the inclined surface. The buffer layer 118a has roughly the same height as the first step part 116a on a surface contacting the first sealing layer 142 and the thickness decreases as the distance from the first step part 116a increases. For example, the height (thickness) of a part of the buffer layer 118a in contact with a step surface may be 80% to 100% of the height of the first step part 116a. A taper surface or an inclined surface may be formed on the upper surface of the buffer layer 118a.

It is possible to arrange the second substrate 104 in close contact with the underlying surface by arranging the buffer layer 118a in the first step part 116a which is formed by the first sealing layer 142. Furthermore, the underling surface in this case corresponds to a region including the first sealing layer 142 and the first opening part 146 arranged in the first substrate 102, and a region including the first step part 116a (or the step difference surface) formed by arranging the end part of the organic insulating layer 144 in the first opening part 146, the first opening part 146 and the wiring part 112a arranged further to the outer side than the first opening part 146.

According to the present embodiment, when the second substrate 104 is arranged to face the first substrate 102 which is arranged with the display part 106 and the first sealing layer 142 which covers the display part 106, by arranging the buffer layer 118a in the first step part 116a which is formed by the second step part 142, it is possible to bond the second substrate 104 without mixing gaps or bubbles in the first step part 116a. In this way, in the case where an optical film such as a transparent resin film or a polarization film is used the second substrate 104, it is possible to reduce appearance defects and the occurrence of defects such as a reduction in visibility. In addition, in the case when the second substrate 104 is used as a protective film during the manufacturing process of a display panel, because it is possible to prevent bubbles being included in the first step part 116a, it is possible to prevent defects occurring during the manufacturing process.

Third Embodiment

Figure 9:
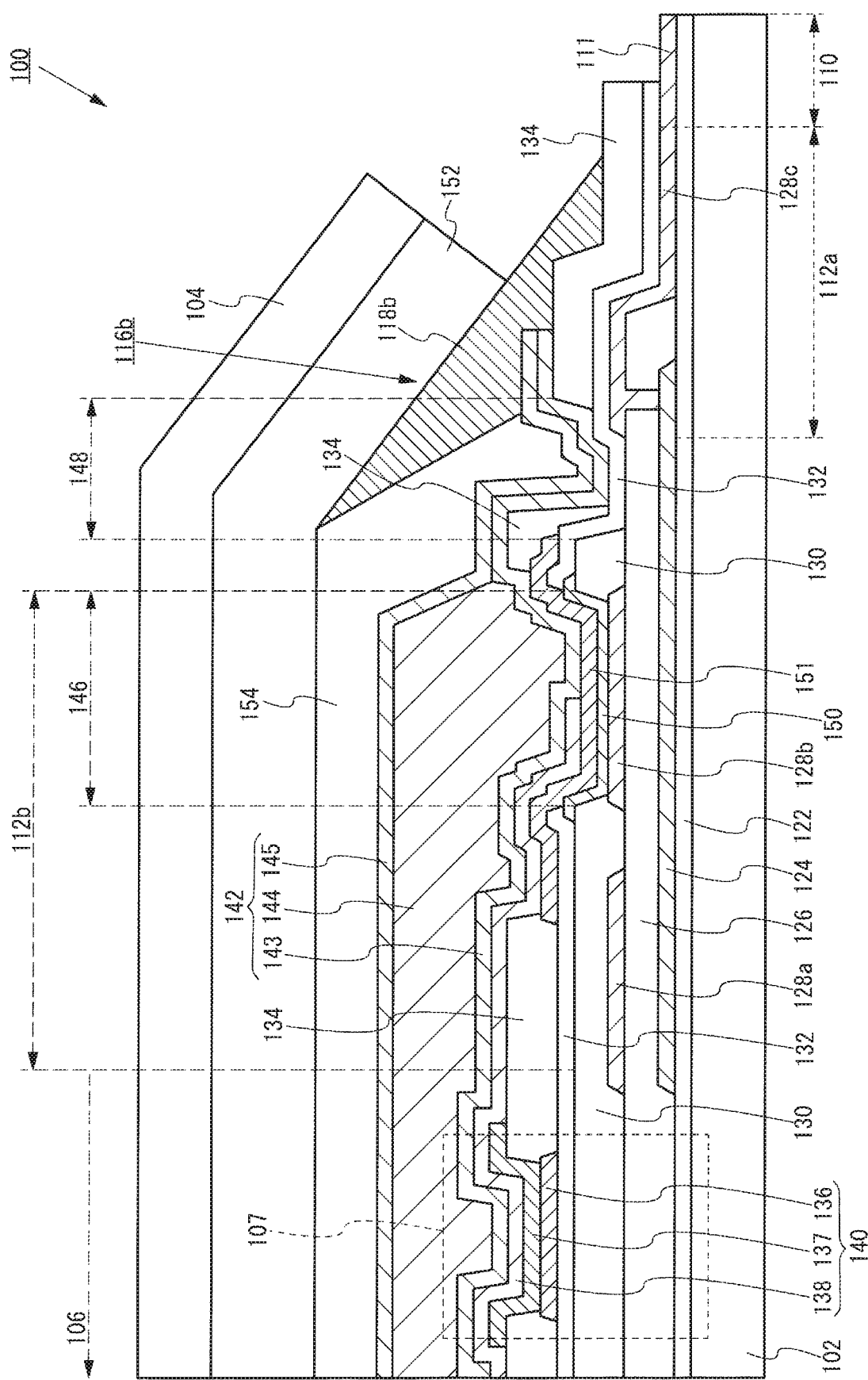
FIG. 9 is a cross-sectional view diagram of a structure of a display device related to one embodiment of the present invention.

The structure of a display device according to the present embodiment is shown in FIG. 9. FIG. 9 shows an aspect in which the second sealing layer 154 is further arranged on the upper layer side of the first sealing layer 142. The second sealing layer 154 covers the upper surface and an end part of the first sealing layer 142, and the end part is arranged further to the inner side than the outer end of the second opening part 148. The second sealing layer 154 is formed from a resin material having translucency such as an epoxy resin and an acrylic resin and the like. That is, the second sealing layer 154 is an organic insulating layer formed from an organic insulating material. The second sealing layer 154 has a thickness of 5 μm to 30 μm, for example, 10 μm. In addition, the second sealing layer 154 is preferred to have a higher hardness than the organic insulating layer 144. By arranging such a second sealing layer 154, it is possible to more reliably protect the display part 106.

By arranging the second sealing layer 154 overlapping the first sealing layer 142, the height of the second step part 116b is higher than the first step part 116a in the structure shown in FIG. 8. When the height of the first step part 116a has a height of at least 10 μm as described above, the second step part 116b may has a height of at least 10 μm or more. The buffer layer 118b is arranged to relieve a step of the second step part 116b which is formed by the formation of the second sealing layer 154. The buffer layer 118b contacts with a region where the second sealing layer 154 and the second step 116b are formed and has an inclined surface where the thickness gradually decreases toward the end of the first substrate 102. That is, the buffer layer 118b has a height roughly the same as the height of the second step part 116b on the surface which contacts with the second sealing layer 154, and the thickness gradually decreases with increasing distance from the second step part 116b. For example, the height (thickness) of a part of the buffer layer 118b in contact with the step surface may be 80% to 100% of the height of the second step part 116b. A taper surface or an inclined surface is formed on the upper surface of the buffer layer 118a.

The second substrate 104 is arranged along the upper surface of the second sealing layer 154 and the surface of the buffer layer 118b via the adhesive layer 152. It is possible to arrange the second substrate 104 in close contact with an underlying surface by arranging the buffer layer 118b in the second step part 116b which is formed by the second sealing layer 154. Furthermore, the underlying surface in this case corresponds to a region arranged in the first substrate 102 and which includes the wiring part 112 further to the outer side than the second sealing layer 154, the second step part 116b and the second opening part 148.

According to the present embodiment, in the case of the second substrate 104 is arranged facing the first substrate 102 which is arranged the display part 106, the first sealing layer 142 covering the display part 106, and the second sealing layer 154, by arranging the buffer layer 118b in the second step part 116b which is formed by the first sealing layer 142 and the second sealing layer 154, it is possible to bond the second substrate 104 to the second step part 116b with no voids or bubbles. In this way, in the case where the second substrate 104 and an optical film such as a transparent resin film or a polarization film are used, it is possible to reduce appearance defects and defects which decrease visibility. In addition, in the case when the second substrate 104 is used as a protective film during the manufacturing process of a display panel, since it is possible to ensure that air bubbles are not included in the second step part 116b, it is possible to prevent the occurrence of defects in the manufacturing process.

Fourth Embodiment

Figure 10:
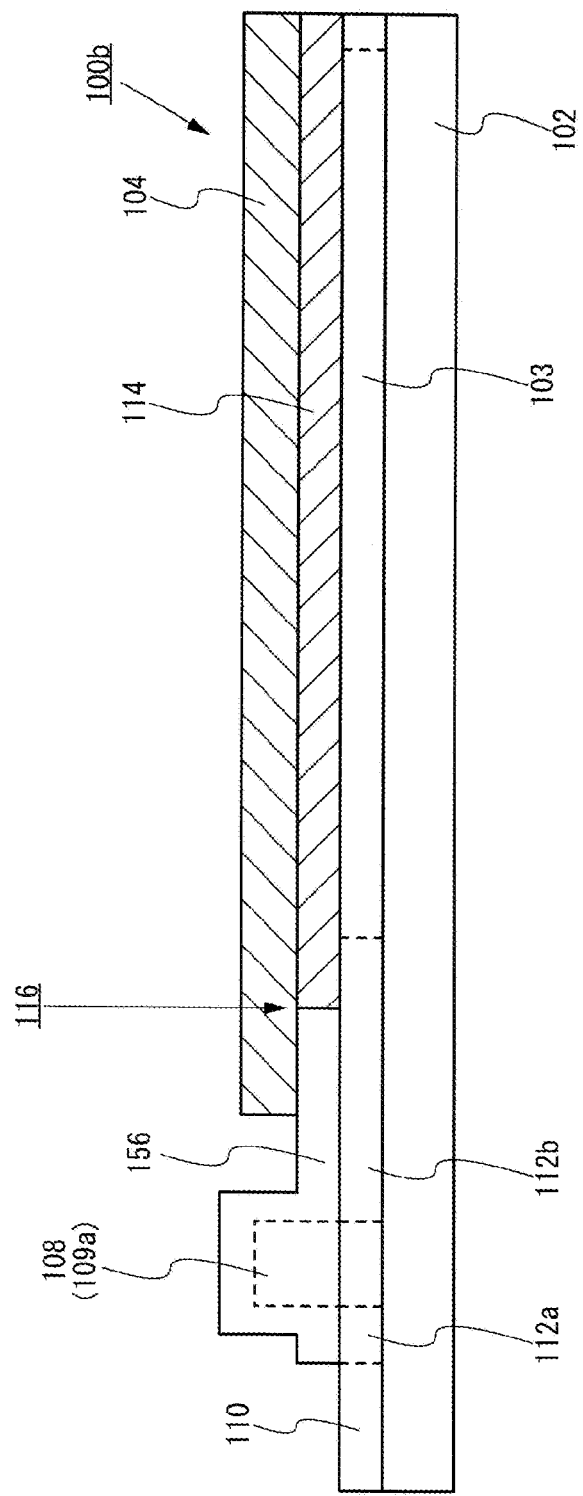
FIG. 10 is a cross-sectional view diagram of a structure of a display device related to one embodiment of the present invention.

The structure of a display device according to the present embodiment is shown in FIG. 10. FIG. 10 shows a cross-sectional structure of a display device 100. The display device 100 shown in FIG. 10 is arranged with an organic film 156 covering the wiring part 112 and the drive circuit part 108 (first drive circuit 109a) arranged on the outer side of the second substrate 104. Other structures in the display device 100b are the same as the display device 100 in the first embodiment.

As is shown in FIG. 10, in a cross-sectional view, the display device 100 is arranged with a sealing layer 114 on the upper surface (surface on the side opposite to the first substrate 102) of the display part 106. The outer end of the sealing layer 114 is arranged further to the outer side than the outer end of the display part 106. The structure of the sealing layer 114 is the same as that in the first embodiment. Since the sealing layer 114 is formed from an insulating film, one side of the sealing layer 114 on the side of the terminal part 110 is arranged in an inner side region which does not reach the end part of the first substrate 102. Therefore, the sealing layer 114 forms at least one step part 116 on the first surface side of the first substrate 102. The height of the step part 116 which is formed by the sealing layer 114 is substantially the thickness of the sealing layer 114 and has a height of 5 μm or more, preferably 10 μm or more. As is described above, since the outer end of the sealing layer 114 is arranged on the outer side of the display part 106, the step part 116 is formed in a region between the display part 106 and the terminal part 110, or between the display part 106 and the drive circuit part 108 (first drive circuit 109a).

The organic film 156 is arranged on the first substrate 102 and covers the wiring part 112 (first wiring part 112a, second wiring part 112b) and the drive circuit part 108 (first drive circuit 109a) as a protective film. The organic film 156 is arranged in contact with the sealing layer 114 at the step part 116. The height (thickness) of the organic film 156 may be roughly equal to or lower than the height of the sealing layer 114. For example, the height (thickness) of the organic film 156 may be 80% to 100% of the height of the step part 116. In addition, the organic film 156 is arranged overlapping a part of the second substrate 104. In this way, the height of the step part 116 of the sealing layer 114 is relieved by the organic film 156. As a result, even when the second substrate 104 is bonded to the first substrate 102 side, it is possible to prevent the formation of gaps at the step part 116 and prevent air bubbles being embraced.

The organic film 156 is preferred to have bendability similar to the first substrate 102 having flexibility, and it is preferred that the organic film 156 has high resistance to bending and has characteristics such that defects such as cracks do not occur. This type of organic film 156 is formed using a resin material such as an epoxy resin, a phenol resin, an acrylic resin and a polyimide resin or the like. In addition, it is possible to use polychloroparaxylylene as the organic film 156. A plurality of types of polychloroparaxylylene having different molecular structures such as parylene C, parylene N, and parylene D are known. Any one of parylene C, parylene N and parylene D can be used as the organic film 156 and among these parylene C having high moisture resistance is preferred.

Figure 11:
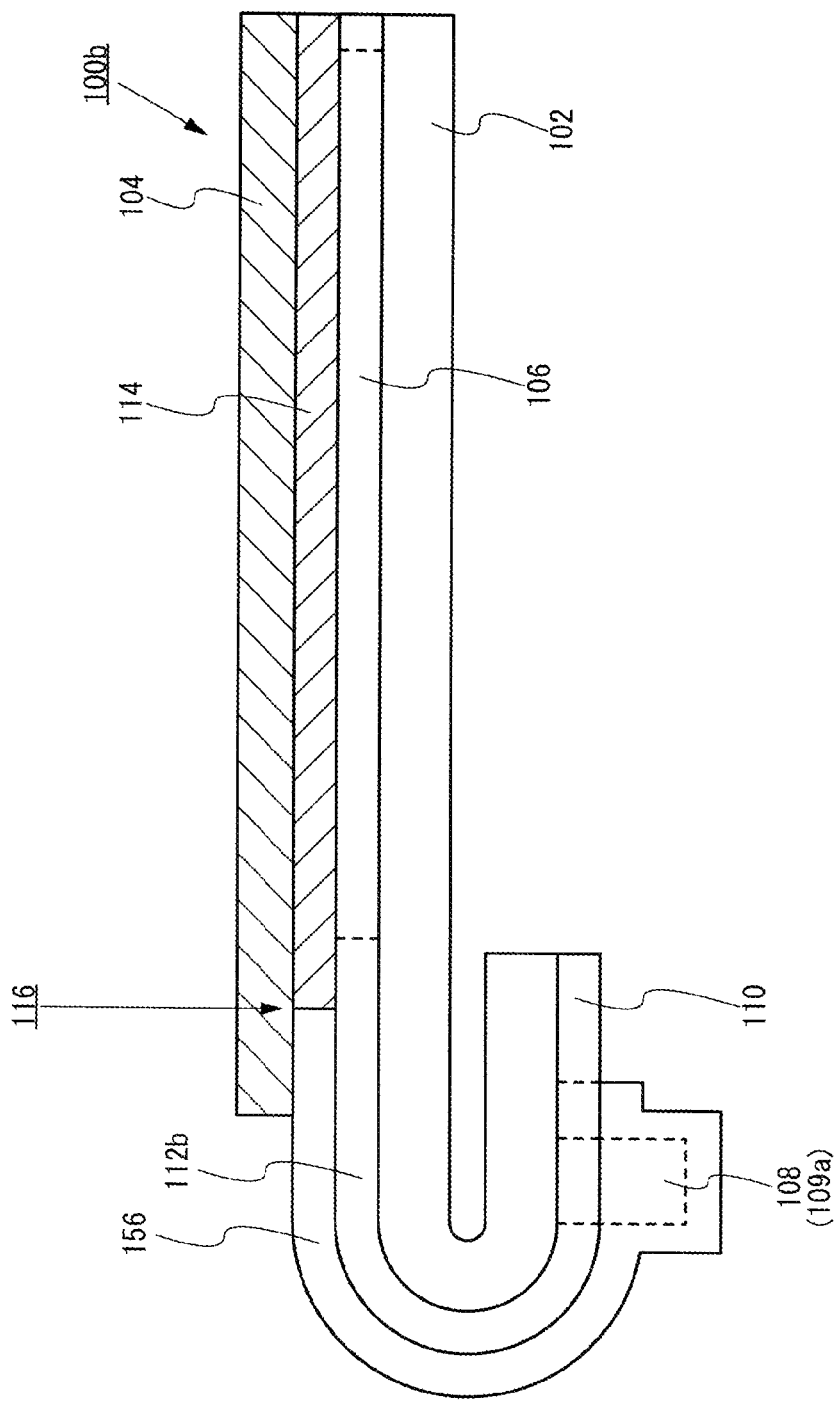
FIG. 11 is a cross-sectional view diagram of a structure of a display device related to one embodiment of the present invention.

FIG. 11 shows a state where the first substrate 102 having flexibility is bent so that a region arranged with the drive circuit part 108 (first drive circuit 109a) and terminal part 110 is arranged on a second surface side opposite to the first surface of the first substrate 102. The second substrate 104 is arranged in close contact with the first substrate 102 side by also providing the organic film 156 with the functions of the buffer layer 118 in the first embodiment to the third embodiment. Therefore, even when the first substrate 102 is bent, it is possible to prevent the end part of the second substrate 104 from peeling off. In this way, it is possible to obtain the same operational effects as in the first embodiment.

Figure 12:
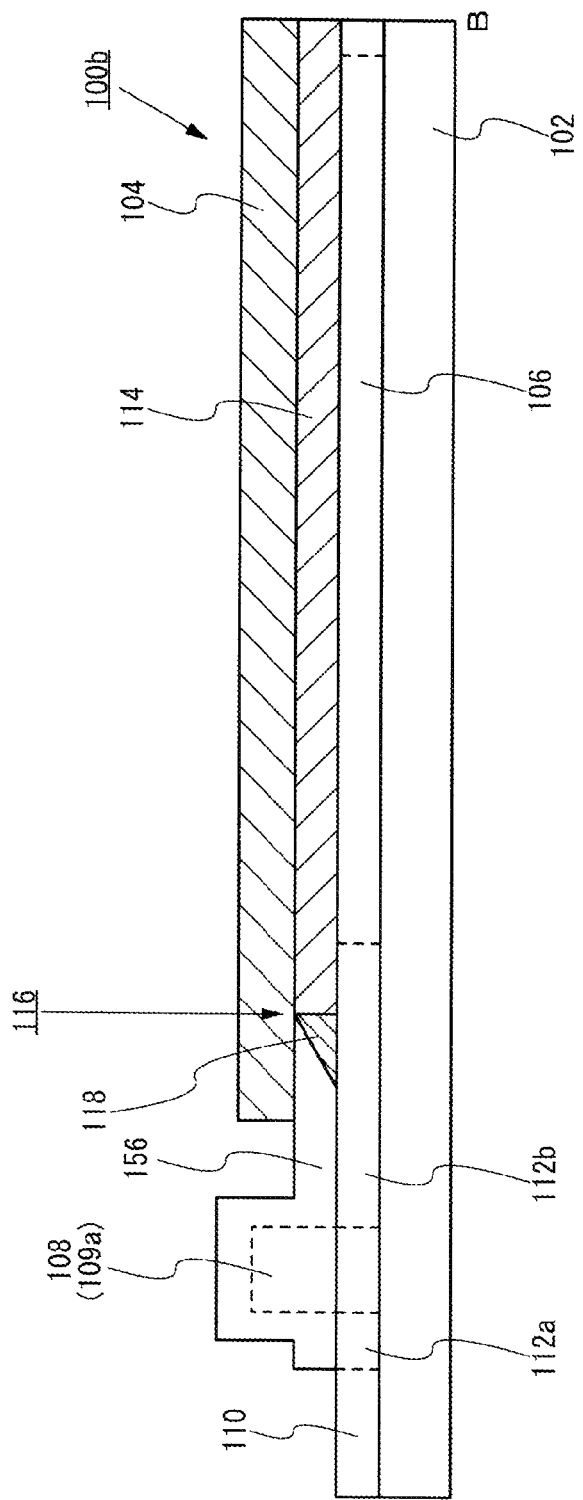
FIG. 12 is a cross-sectional view diagram of a structure of a display device related to one embodiment of the present invention.

As is shown in FIG. 12, a buffer layer 118 may be further arranged in addition to the organic film 156. By adopting such a structure, it is possible to more reliably relieve any steps caused by the step part 116. In addition, even when the second substrate 104 is bonded to the first substrate 102 side, it is possible to prevent the formation of gaps in the step part 116 and prevent bubbles being embraced.

Figure 13:
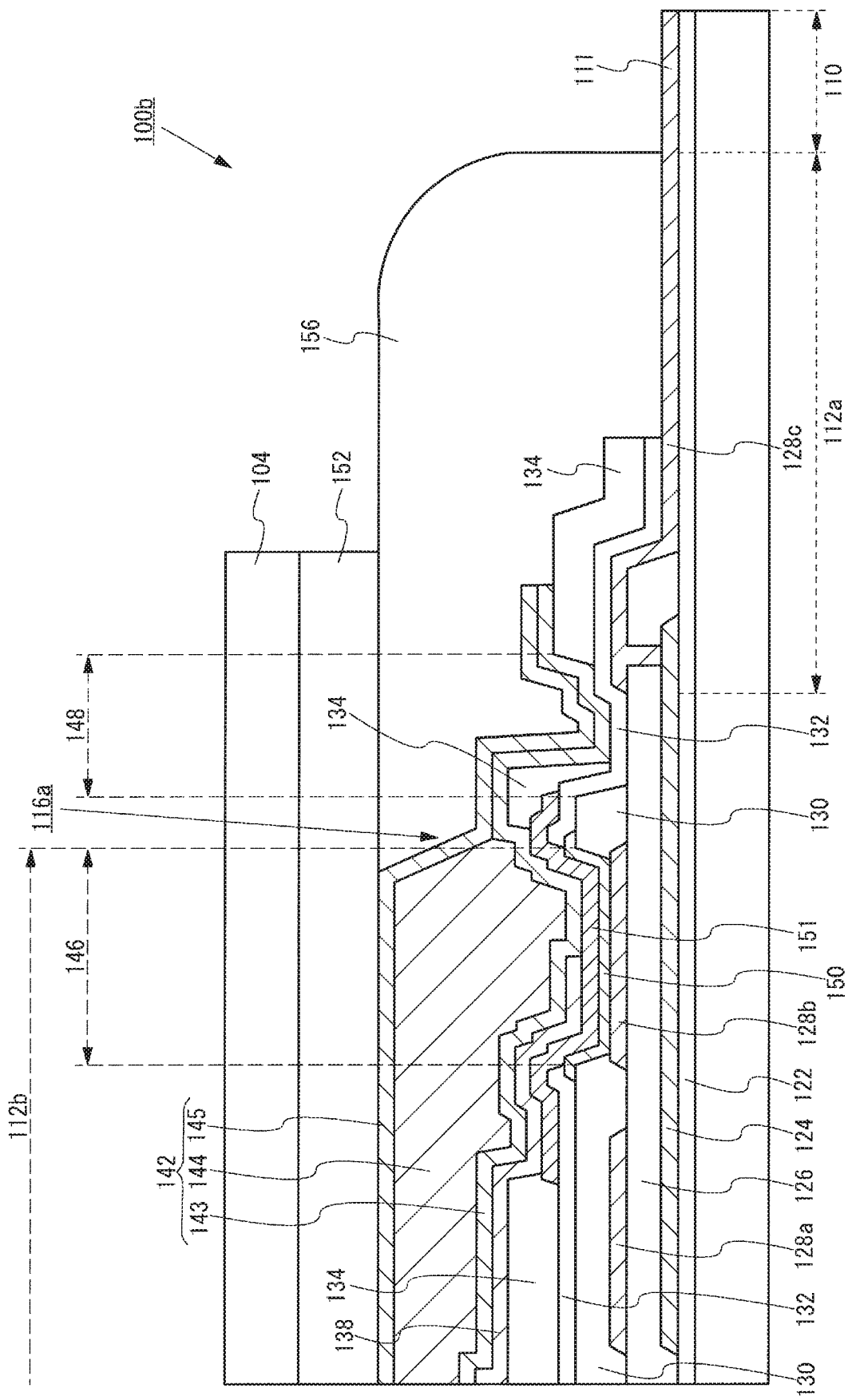
FIG. 13 is a cross-sectional view diagram of a structure of a display device related to one embodiment of the present invention.

A detailed structure of the display device 100 shown in FIG. 10 is shown in FIG. 13. FIG. 13 shows a cross-sectional structure of the display device 100. In FIG. 13, the structure of each layer other than the organic film 156 is the same as that in the second embodiment. Furthermore, the display part is omitted from FIG. 13.

The organic film 156 is arranged from a region of the first wiring part 112a to a region which reaches the first sealing layer 142. One end of the organic film 156 contacts the first sealing layer 142. Although the end part of the first sealing layer 142 has an inclined surface, the organic film 156 is arranged so as to bury this inclined surface. The height of the organic film 156 may be the same height as the height of the first step part 116a or lower than the height of the second step part 116b in the region contacting the first sealing layer 142. In other words, the height (thickness) of the organic film 156 may be roughly equal to or lower than the height of the first sealing layer 142. For example, the height (thickness) of the organic film 156 may be 80% to 100% of the height of the first step part 116a (or the height of the second sealing layer 154).

Figure 14:
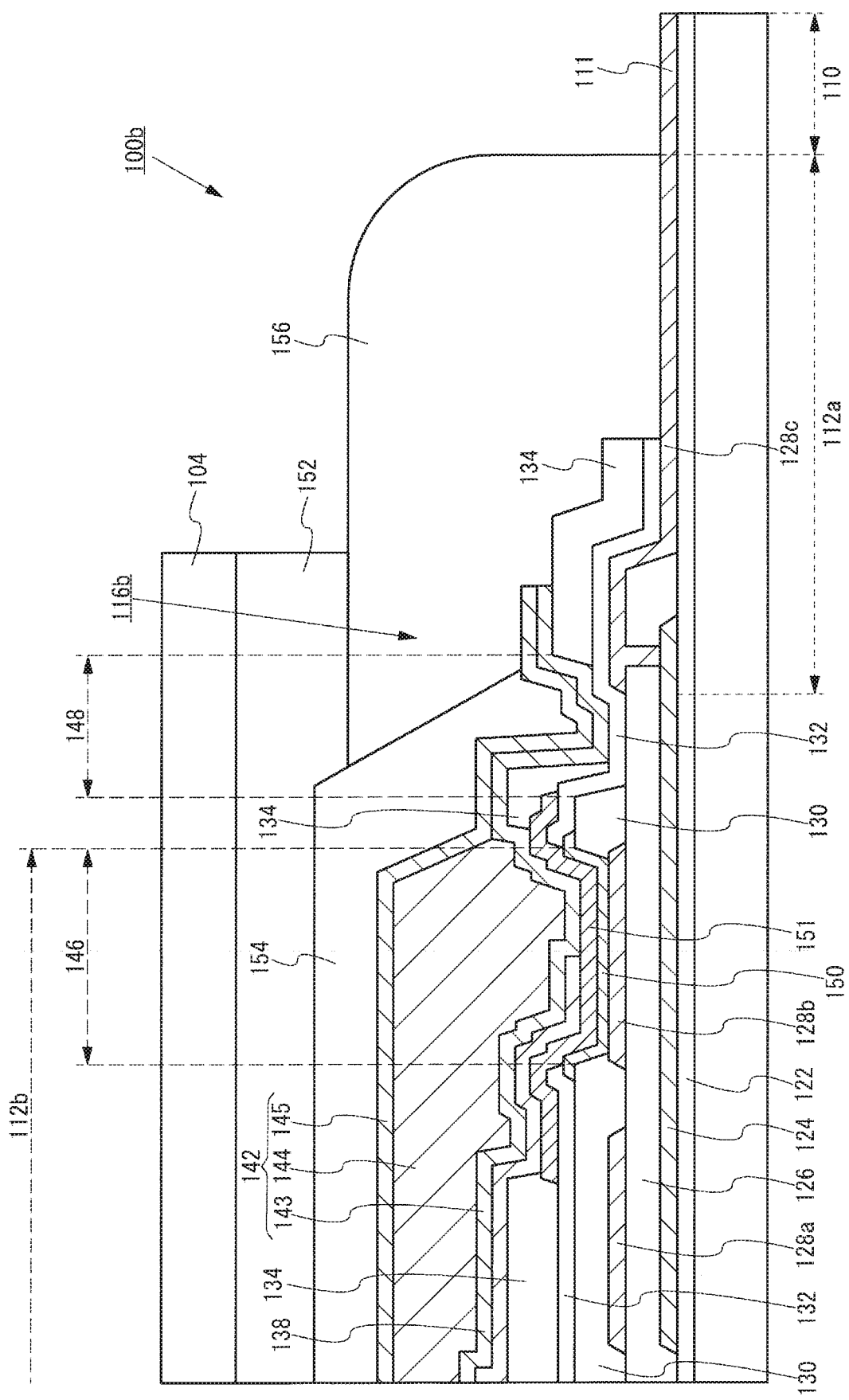
FIG. 14 is a cross-sectional view diagram of a structure of a display device related to one embodiment of the present invention.

FIG. 14 shows an aspect in which the second sealing layer 154 is arranged in addition to the first sealing layer 142 in the display device 100. In FIG. 14, at least one end of the first sealing layer 142 is arranged in an inner region which does not reach the end part of the first substrate 102, and at least one end of the second sealing layer 154 is arranged in a region between an end part of the first sealing layer 142 and an end part of the first substrate 102. In this way, the second step part 116b is formed along one end of the second sealing layer 152. The organic film 156 is arranged from a region of the first wiring part 112a to a region which reaches the second sealing layer 154. One end of the organic film 156 contacts the second sealing layer 154 at the second step part 116b. Although the end part of the second sealing layer 154 is an inclined surface, the organic film 156 is arranged to bury this inclined surface. The height of the organic film 156 may be the same height as the height of the second step part 116b or lower than the height of the second step part 116b in the region in contact with the second sealing layer 154. In other words, the height (thickness) of the organic film 156 may be roughly equal to or lower than the height of the second sealing layer 154. For example, the height (thickness) of the organic film 156 may be 80% to 100% of the height of the second step part 116b (or the height of the second sealing layer 154).

By arranging this type of organic film 156, when the second substrate 104 is bonded to the first substrate 102 via the adhesive layer 152, it is possible to prevent gaps being formed in a region of the second step part 116b and it is possible to prevent embracing bubbles. In addition, in the present embodiment, by relieving a step of the second step part 116b caused by the organic film 156 which is used as a protective film of the wiring part 112 and the drive circuit part 108, it is possible to omit a buffer as in the first to third embodiments.

Supplementary Note

As is shown in the first to fourth embodiments, a display device according to one embodiment of the present invention includes the following structures.
[Structure 1]
A display device having a first substrate including a first surface, a first inorganic insulating layer (first insulating layer) above the first surface, a second inorganic insulating layer (second insulating layer) above the first inorganic insulating layer, a first organic insulating layer (third insulating layer) above the second inorganic insulating layer, a third inorganic insulating layer (fourth insulating layer) above the first organic insulating layer, a wiring layer contacting the second inorganic insulating layer (second insulating layer), a light emitting element in which a pixel electrode, an organic EL layer and a common electrode are stacked above the third inorganic insulating layer (fourth insulating layer), a second organic insulating layer (fifth insulating layer) covering an end part of the pixel electrode and arranged with an opening part exposing an inner region, and a first sealing layer arranged on the light emitting element and an upper layer of the fifth insulating layer, wherein a first opening part surrounding a region where the light emitting element is arranged and from which the first organic insulating layer (third insulating layer) and the second organic insulating layer (fifth insulating layer) are removed, and a second opening part surrounding the first opening part and from which the first organic insulating layer (third insulating layer) and the second organic insulating layer (fifth insulating layer) are removed in an outer region of the first opening part are arranged, the first sealing layer includes an organic insulating layer, a lower layer inorganic insulating layer (first inorganic insulating layer) on a lower layer side and an upper layer inorganic upper layer (second inorganic insulating layer) on an upper layer side of the organic insulating layer, wherein by arranging an end part of the organic insulating layer of the first sealing layer on an inner side of the first opening part, arranging an end part of the lower inorganic insulating layer (first inorganic insulating layer) and the upper inorganic insulating layer (second inorganic insulating layer) further to the outer side of the first opening part, and arranging the organic insulating layer further to the inner side than an end part of the lower inorganic insulating layer (first inorganic insulating layer) and an end part of the upper inorganic insulating layer (second inorganic insulating layer), a first step part is formed, a buffer layer is arranged adjacent to the first step part, the buffer layer has a thickness which decreases with increasing distance from the first step part, a second substrate is arranged facing a first surface of the first substrate, and is arranged along an upper surface of the first sealing layer and an upper surface of the buffer layer.
[Structure 2]
The buffer layer is in contact with the first sealing layer at the first step part.
[Structure 3]
The height of the region where the buffer layer is in contact with the first sealing layer is approximately equal to the height of the first step part.
[Structure 4]
The height of the region where the buffer layer is in contact with the first sealing layer is 80% to 100% of the height of the first step part.
[Structure 5]
A second sealing layer is further included between the first sealing layer and the second substrate, at least one end of the second sealing layer is arranged in a region between an end part of the organic insulating film of the first sealing layer and an end part of the first substrate and forms a second step part along one end of the second sealing layer, the buffer layer is arranged in the second step part and has a thickness which decreases as it moves away from the second step part, and the second substrate is arranged along the upper surface of the second sealing layer and the upper surface of the buffer layer.
[Structure 6]
The buffer layer is in contact with the second sealing layer at the second step part.
[Structure 7]
The height of the region where the buffer layer is in contact with the second sealing layer is approximately equal to the height of the second step part.
[Structure 8]
The height of the region where the buffer layer is in contact with the second sealing layer is 80% to 100% of the height of the second step part.
[Structure 9]
The buffer layer surrounds the display part.
[Structure 10]
The first substrate and the second substrate have flexibility.
[Structure 11]
A display device having a first substrate including a first surface, a first inorganic insulating layer (first insulating layer) above the first surface, a second inorganic insulating layer (second insulating layer) above the first inorganic insulating layer, a first organic insulating layer (third insulating layer) above the second inorganic insulating layer, a third inorganic insulating layer (fourth insulating layer) above the first organic insulating layer, a wiring layer contacting the second inorganic insulating layer (second insulating layer), a light emitting element in which a pixel electrode, an organic EL layer and a common electrode are stacked above the third inorganic insulating layer (fourth insulating layer), a second organic insulating layer (fifth insulating layer) covering an end part of the pixel electrode and arranged with an opening part exposing an inner region, and a first sealing layer arranged on the light emitting element and an upper layer of the fifth insulating layer, wherein a first opening part surrounding a region where the light emitting element is arranged and from which the first organic insulating layer (third insulating layer) and the second organic insulating layer (fifth insulating layer) are removed, and a second opening part surrounding the first opening part and from which the first organic insulating layer (third insulating layer) and the second organic insulating layer (fifth insulating layer) are removed in an outer region of the first opening part are arranged, the first sealing layer includes an organic insulating layer, a lower layer inorganic insulating layer (first inorganic insulating layer) on a lower layer side and an upper layer inorganic upper layer (second inorganic insulating layer) on an upper layer side of the organic insulating layer, wherein by arranging an end part of the organic insulating layer of the first sealing layer on an inner side of the first opening part, arranging an end part of the lower inorganic insulating layer (first inorganic insulating layer) and the upper inorganic insulating layer (second inorganic insulating layer) further to the outer side of the first opening part, and arranging the organic insulating layer further to the inner side than an end part of the lower inorganic insulating layer (first inorganic insulating layer) and an end part of the upper inorganic insulating layer (second inorganic insulating layer) a first step part is formed, an organic film is arranged adjacent to the first step part, a second substrate is arranged facing a first surface of the first substrate, and is arranged along an upper surface of the first sealing layer and an upper surface of the organic film.

[Structure 12]

The organic film is in contact with the first sealing layer at the first step part.

[Structure 13]

The height of the region where the organic film is in contact with the first sealing layer is approximately equal to the height of the first step part.

[Structure 14]

The height of the region where the organic film is in contact with the first sealing layer is 80% to 100% of the height of the first step part.

[Structure 15]

A second sealing layer is further included between the first sealing layer and the second substrate, at least one end of the first sealing layer is arranged in a region on an inner side which does not reach the first substrate, at least one end of the second sealing layer is arranged in a region between an end part of the first sealing layer and an end part of the first substrate, a second step part is formed along one end of the second sealing layer, the organic film extends up to the second step part, and the second substrate is arranged along an upper surface of the second sealing layer and an upper surface of the organic film.

[Structure 16]

The organic film is in contact with the second sealing layer at the second step part.

[Structure 17]

The height of the region where the organic film is in contact with the second sealing layer is approximately equal to the height of the second step.

[Structure 18]

The height of the region where the organic film is in contact with the second sealing layer is 80% to 100% of the height of the second step part.

[Structure 19]

The organic film has flexibility.

[Structure 20]

The first substrate and the second substrate have flexibility.

What is claimed is:

1. A display device comprising:
   a first substrate including a display part arranged with a plurality of pixels and a terminal part arranged in an outside of the display part, the display part and the terminal part being on a first surface of the first substrate;
   a second substrate facing the first surface and is made of a resin material;
   a first sealing layer arranged between the first substrate and the second substrate;
   a buffer layer covering an outer edge of the first sealing layer;
   an insulating layer between the first sealing layer and the first substrate, wherein the insulating layer extends outward from an outermost edge of the buffer layer toward the terminal part; and
   an adhesive layer arranged between the buffer layer and the second substrate, and between the first sealing layer and the second substrate in a cross-sectional view, the adhesive layer extending outside the outermost edge of the buffer layer,
   wherein
   a part of an end part of the first sealing layer is arranged between the display part and the terminal part;
   the part of the end part and an upper surface of the first sealing layer form a first step part;
   the buffer layer is located at the first step part without overlapping with the display part and has a distance from the surface of the second substrate side to the first substrate which decreases as a distance from the display part increases; and
   the second substrate is arranged along the upper surface of the first sealing layer and an upper surface of the buffer layer, extends outside the end part of the first sealing layer, is bonded to an upper surface of the buffer layer via the adhesive layer, and is bonded to the insulating layer in a region between the buffer layer and the terminal part via the adhesive layer.

2. The display device according to claim 1, wherein each of the plurality of pixels includes a light emitting element, and the first sealing layer covers the light emitting element.

3. The display device according to claim 1, wherein the buffer layer contacts the first sealing layer at the first step part, and a height of a region where the buffer layer contacts with the first sealing layer matches a height of the first step part.

4. The display device according to claim 1, wherein the buffer layer contacts the first sealing layer at the first step part, and a height of a region where the buffer layer contacts with the first sealing layer is 80% to 100% of a height of the first step part.

5. The display device according to claim 1, further comprising a second sealing layer between the first sealing layer and the second substrate;
   wherein
   a part of an end part of the second sealing layer is located at an opposite side of the part of the end part of the first sealing layer from the terminal part;
   an upper surface of the second sealing layer and the part of the end part of the second sealing layer form a second step part;
   the buffer layer is arranged at the second step part and has a thickness which decreases as a distance from the second step increases; and
   the second substrate is arranged along the upper surface of the second sealing layer and the upper surface of the buffer layer.

6. The display device according to claim 5, wherein the first sealing layer includes an inorganic insulating layer and an organic insulating layer, and the second sealing layer is an organic insulating layer in contact with the inorganic insulating layer.

7. The display device according to claim 5, wherein the buffer layer contacts with the second sealing layer at the second step part, and a height of a region where the buffer layer contacts with the second sealing layer matches a height of the second step part.

8. The display device according to claim 5, wherein the buffer layer contacts with the second sealing layer at the second step part, and a height of a region where the buffer layer contacts with the second sealing layer is 80% to 100% of a height of the second step part.

9. The display device according to claim 1, wherein the buffer layer surrounds the display part.

10. The display device according to claim 1, wherein the buffer layer includes a first end part in contact with the first substrate and a second end part in contact with the first sealing layer,
   wherein the second substrate is in close contact with the buffer layer, a region where the first end part contacts with the first substrate, and a region where the second end part contacts with the first sealing layer.

11. The display device according to claim 1, wherein the first substrate is flexible.

* * * * *